US010790031B1

(12) United States Patent
Sagdeo et al.

(10) Patent No.: US 10,790,031 B1
(45) Date of Patent: Sep. 29, 2020

(54) SYSTEM HANDLING FOR FIRST READ READ DISTURB

(71) Applicant: Western Digital Technologies, Inc., San Jose, CA (US)

(72) Inventors: Piyush Sagdeo, San Jose, CA (US); Chris Yip, San Jose, CA (US); Sourabh Sankule, San Jose, CA (US); Pitamber Shukla, San Jose, CA (US); Anubhav Khandelwal, San Jose, CA (US); Mohan Dunga, San Jose, CA (US); Niles Yang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/432,116

(22) Filed: Jun. 5, 2019

(51) Int. Cl.
*G11C 16/34* (2006.01)
*G11C 29/50* (2006.01)
*G06F 11/07* (2006.01)

(52) U.S. Cl.
CPC ........ *G11C 16/3418* (2013.01); *G06F 11/076* (2013.01); *G06F 11/0793* (2013.01); *G11C 16/34* (2013.01); *G11C 16/3422* (2013.01); *G11C 29/50012* (2013.01); *G11C 2029/5004* (2013.01); *G11C 2211/563* (2013.01)

(58) Field of Classification Search
CPC . G11C 16/34; G11C 16/3418; G11C 16/3422; G11C 2211/563
See application file for complete search history.

(56) References Cited

U.S. PATENT DOCUMENTS

| | | | |
|---|---|---|---|
| 9,202,534 B2 * | 12/2015 | An | G11C 11/5642 |
| 9,804,785 B2 * | 10/2017 | Cohen | G06F 3/0632 |
| 10,026,486 B1 * | 7/2018 | Dutta | G11C 16/3459 |
| 2014/0098593 A1 * | 4/2014 | Calderoni | G11C 13/004 |
| | | | 365/148 |

* cited by examiner

*Primary Examiner* — Vanthu T Nguyen
(74) *Attorney, Agent, or Firm* — Morgan, Lewis & Bockius LLP (57) ABSTRACT

A data storage system performs operations including receiving a data read command corresponding to a first memory cell; determining whether the first memory cell is in a first read condition; if the first memory cell is in the first read condition: applying a first voltage level to the first memory cell, the first voltage level being a predetermined voltage level corresponding to a read operation for memory cells in the first read condition; and sensing a first level of current, or lack thereof, through the first memory cell during application of the first voltage level to the first memory cell; and if the first memory cell is not in the first read condition: applying a second voltage level to the first memory cell, the second voltage level being a voltage level corresponding to a read operation for memory cells in a read condition other than the first read condition.

20 Claims, 7 Drawing Sheets

SYSTEM HANDLING FOR FIRST READ READ DISTURB

TECHNICAL FIELD

The present disclosure relates to memory systems, and in particular, to accounting for read disturb errors when memory cells are in a first read condition.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity in turn stokes demand for greater storage density, so that specifications such as power consumption and form factor may be maintained and preferably reduced. As such, there is ongoing pressure to increase the storage density of non-volatile memories in order to further improve the useful attributes of such devices. However, a drawback of increasing storage density is that the stored data is increasingly prone to storage and/or reading errors.

SUMMARY

Various implementations of systems, methods and devices within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description" one will understand how the features of various implementations are used to reduce bit error rate in first read scenarios.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

The various implementations described herein include systems, methods and/or devices that read data from memory cells by optimizing read levels for first read conditions.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

Figure 1:
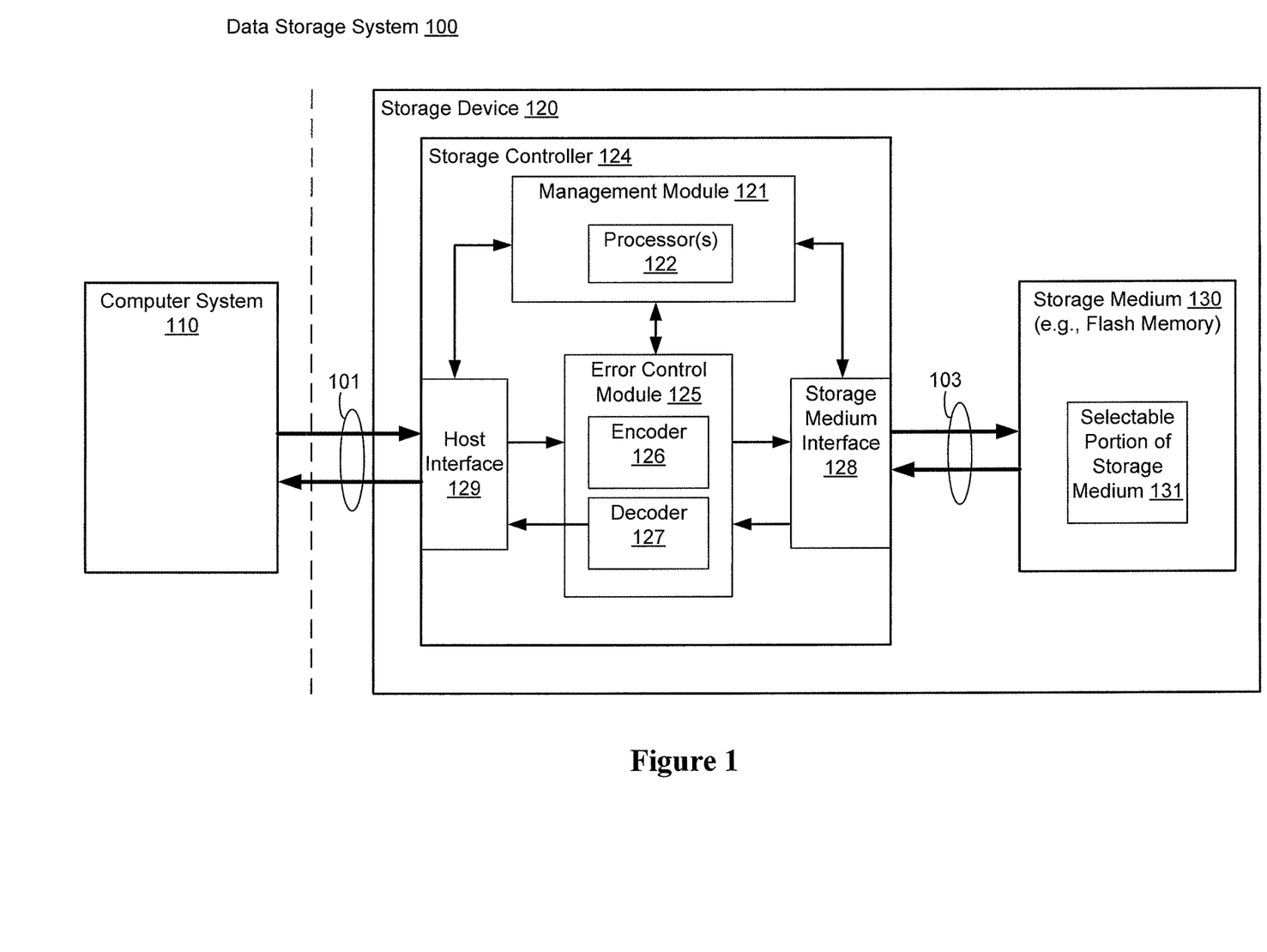
FIG. 1 is a schematic diagram of a data storage environment, in accordance with some embodiments.

FIG. 1 is a diagram of an implementation of a data storage environment, namely data storage environment 100. While certain specific features are illustrated, those skilled in the art will appreciate from the present disclosure that various other features have not been illustrated for the sake of brevity, and so as not to obscure more pertinent aspects of the example implementations disclosed herein. To that end, as a non-limiting example, data storage environment 100 includes data processing system (computer system) 110, and storage device 120.

Data processing system 110 is coupled to storage device 120 through data connections 101. Those skilled in the art will appreciate from the present disclosure that in various implementations data processing system 110 includes storage device 120 as a component. Generally, data processing system 110 includes any suitable computer device, such as a computer, a laptop computer, a tablet device, a netbook, an internet kiosk, a personal digital assistant, a mobile phone, a smart phone, a gaming device, a computer server, or any other computing device. In some implementations, data processing system 110 includes one or more processors, one or more types of memory, a display and/or other user interface components such as a keyboard, a touch screen display, a mouse, a track-pad, a digital camera and/or any number of supplemental devices to add functionality.

Storage device 120 includes one or more storage mediums 130 coupled to storage controller 124 through data connections 103. Those skilled in the art will appreciate from the present disclosure that in various implementations storage controller 124 and storage medium(s) 130 are included in the same device (e.g., storage device 120) as constituent components thereof, while in other embodiments storage controller 124 and storage medium(s) 130 are, or are in, separate devices. Each storage medium 130 includes any number (i.e., one or more) of memory devices including, without limitation, non-volatile semiconductor memory devices, such as flash memory. For example, flash memory devices can be configured for enterprise storage suitable for applications such as cloud computing. Additionally, and/or alternatively, flash memory devices can also be configured for relatively smaller-scale applications such as personal flash drives or hard-disk replacements for personal, laptop and tablet computers. In some implementations, a storage medium 130 comprises one or more flash memory devices.

In some implementations, a storage medium 130 comprises at least one of NAND-type flash memory and/or NOR-type flash memory.

Storage mediums are often divided into a number of addressable and individually selectable blocks, such as selectable portion 131. In some implementations, for flash memory, the individually selectable blocks are the minimum erasable units in a flash memory device. In other words, each block contains a minimum number of memory cells that can be erased simultaneously. Each block is usually further divided into a plurality of pages, where each page is typically an instance of a minimum unit of the smallest individually accessible sub-block in the block. However, in some implementations (e.g., in some types of flash memory), the minimum unit of individually accessible data is a sector, which is a subset of a page. That is, each page contains a plurality of sectors and each sector is the minimum unit of individually accessible data for writing data to or reading data from the flash memory device.

For the sake of notation only, a block of data includes a plurality of pages, typically a fixed number of pages per block, and each page includes a plurality of sectors, typically a fixed number of sectors per page. For example, in some implementations, one block includes 64 pages, 128 pages, 256 pages, or another suitable number of pages. The respective sizes of blocks, pages and sectors are often a matter of design choice or end-user choice, and often differ across a wide range of enterprise and consumer devices. However, for example only, and without limitation, in some enterprise applications a page includes 2K (i.e., 2048) to 16K bytes, and a sector includes anywhere from 256 bytes to 544 bytes. Those ranges may be extended upward or downward, and/or shrink or expand depending on a particular application. In some embodiments, each page stores one or more codewords, where a codeword is the smallest unit of data that is separately encoded and decoded by the encoder and decoder mechanisms of a particular device.

In some implementations, storage controller 124 includes management module 121, error control module 125, storage medium interface (I/O) 128 and host interface 129. Host interface 129 couples storage device 120 and its storage controller 124 to one or more computer systems 110, while storage medium interface 128 coupled storage controller 124 to storage medium(s) 130. Those skilled in the art will appreciate from the present disclosure that storage controller 124 includes various additional features that have not been illustrated for the sake of brevity, and so as not to obscure more pertinent features of the example implementations disclosed herein, and that a different arrangement of features may be possible.

Host interface 129 typically includes data buffers (not shown) to buffer data being received and transmitted by storage device 120, via data connections 101. Similarly, storage medium I/O 128 provides an interface to storage medium(s) 130 though data connections 103. In some implementations, storage medium interface 128 includes read and write circuitry.

In some implementations, management module 121 includes one or more processors 122. However, those skilled in the art will appreciate from the present disclosure that, in some implementations, processor 122 is shared by one or more components within, and in some cases, beyond the function of storage controller 124. Management module 121 is coupled to host interface 129, error control module 125 and storage medium I/O 128 in order to coordinate the operation of these components.

Error control module 125 is coupled between storage medium I/O 128 and host interface 129. In some implementations, error control module 125 is provided to limit the number of uncorrectable errors inadvertently introduced into data. To that end, error control module 125 includes encoder 126 and decoder 127. Encoder 126 encodes data to produce a codeword which is subsequently stored in a storage medium 130. When the encoded data is read from the storage medium 130, decoder 127 applies a decoding process to recover the data, and correct errors within the error correcting capability of the error control code. Those skilled in the art will appreciate from the present disclosure that various error control codes have different error detection and correction capacities, and that particular codes are selected for various applications for reasons beyond the scope of this disclosure.

Figure 2:
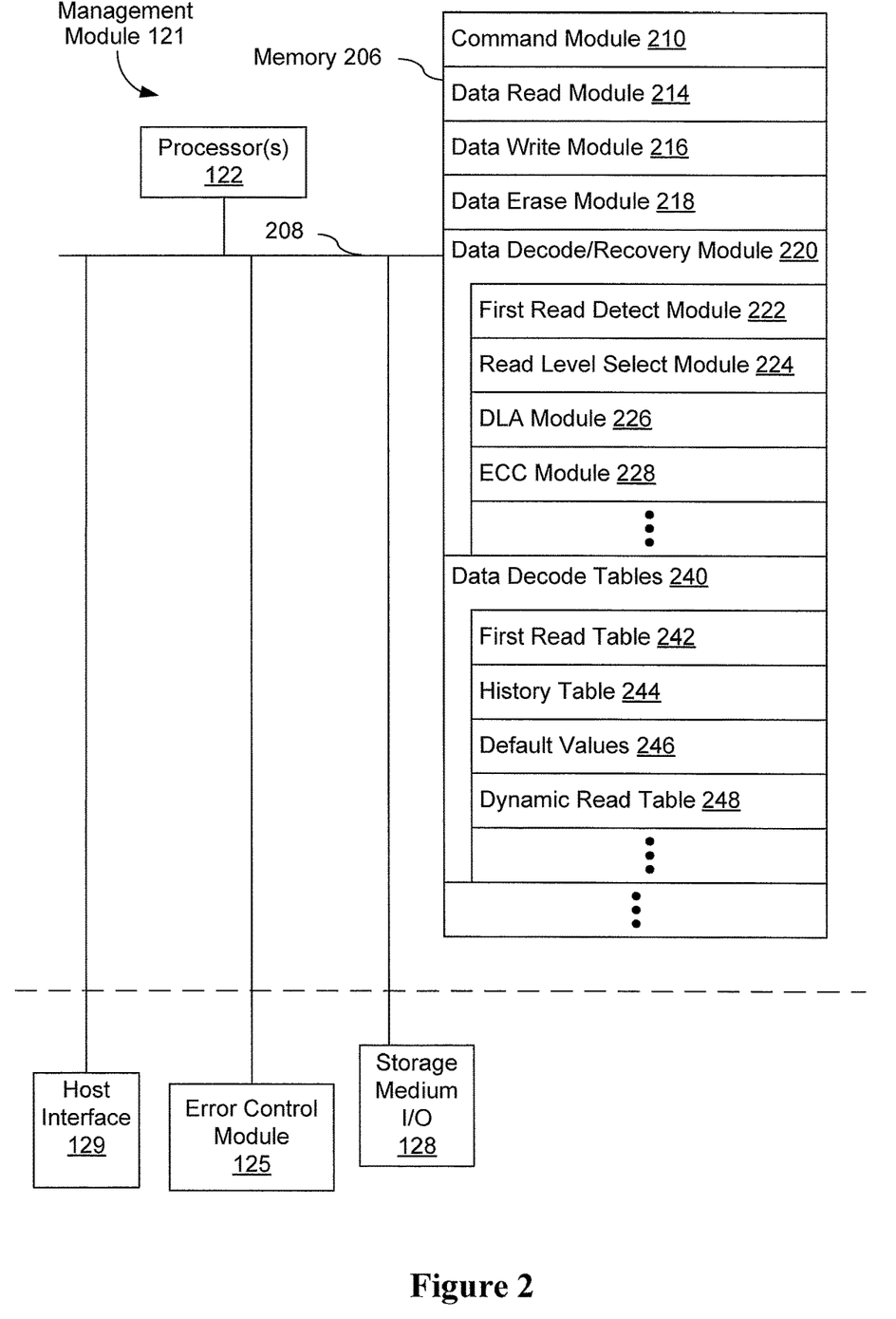
FIG. 2 is a block diagram of a management module in the storage controller of a storage device, in accordance with some embodiments.

FIG. 2 illustrates a block diagram of management module 121 in accordance with some embodiments. Management module 121 typically includes: one or more processors 122 (sometimes referred to herein as CPUs, processing units, hardware processors, processors, microprocessors or microcontrollers) for executing modules, programs and/or instructions stored in memory 206 and thereby performing processing operations. Management module 121 also includes memory 206 (sometimes referred to herein as controller memory), and one or more communication buses 208 for interconnecting these components. Communication buses 208 optionally include circuitry (sometimes called a chipset) that interconnects and controls communications between system components. Management module 121 is coupled by communication buses 208 to storage medium interface 128, error control module 125, and host interface 129. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the one or more processors 122. In some embodiments, memory 206, or alternatively the non-volatile memory device(s) within memory 206, comprises a non-transitory computer readable storage medium. In some embodiments, memory 206, or the non-transitory computer readable storage medium of memory 206, stores the following programs, modules, and data structures, or a subset or superset thereof:

command module (sometimes called an interface module) 210 for receiving or accessing a host command specifying an operation to be performed and a logical or physical address corresponding to a selectable portion 131 of storage medium 130 within the storage device 120 (FIG. 1);

data read module 214 for reading data from storage medium 130 (e.g., non-volatile memory);

data write module 216 for writing data to storage medium 130;

data erase module 218 for erasing data in storage medium 130;

data decoding or recovery module 220 for decoding or recovering a codeword; data decoding or recovery module 220 optionally includes:

first read detect module 222 for determining whether one or more memory cells in a selectable portion 131 of storage medium 130 is in a first read condition;

read level select module 224 for selecting a read voltage to apply to a memory cell in accordance with various read conditions or read error handling processes;

data look ahead (DLA) module 226 for performing a DLA process on one or more memory cells during read error handling; and error-correcting code (ECC) module 228 for performing an ECC process on one or more memory cells during read error handling;

data decode tables 240 for storing read voltage values for use in read operations, the tables including:

first read table 242 for storing one or more read voltage values for use when reading a memory cell in a first read condition;

history table 244 for storing one or more recently used read voltage values resulting in successful read operations (e.g., history cases);

default values 246 for storing one or more read voltage values for use as default read voltage values for reading memory cells;

dynamic read table 248 for storing one or more read voltage values for use during dynamic read cases (e.g., different kinds of read voltage shifts for different conditions, such as read disturb);

Further information regarding the modules and data structures listed above is provided in the following discussions. Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the non-transitory computer readable storage medium of memory 206, provide instructions for implementing any of the methods described below. Stated another way, the programs or modules stored in memory 206, when executed by the one or more processors 122, cause storage device 120 to perform any of the methods described below. Although FIG. 2 shows a management module 121, FIG. 2 is intended more as functional description of the various features which may be present in a management module than as a structural schematic of the embodiments described herein. In practice, and as recognized by those of ordinary skill in the art, the programs, modules, and data structures shown separately could be combined and some programs, modules, and data structures could be separated.

Figure 3:
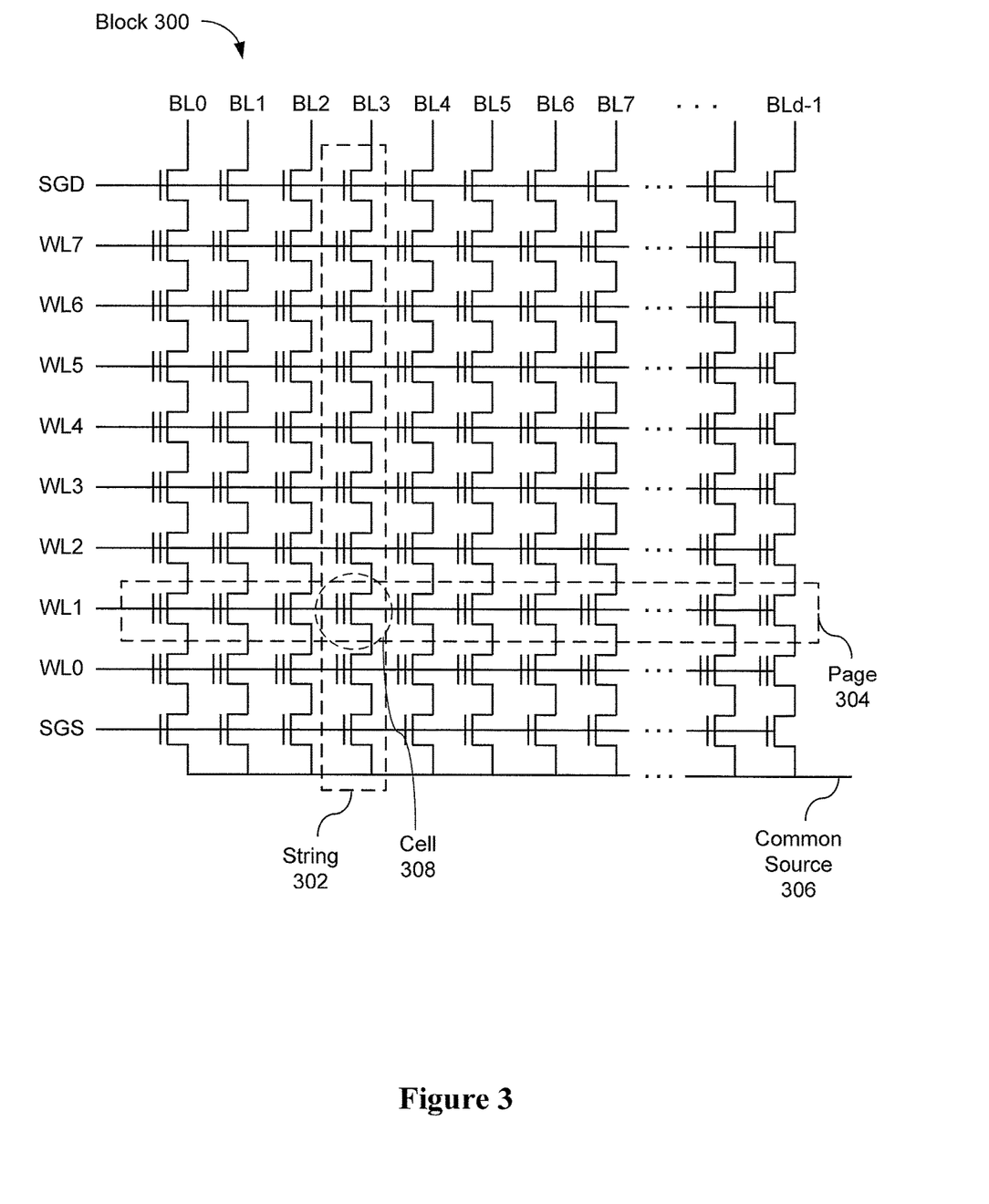
FIG. 3 is a memory cell array in the storage medium of a storage device, in accordance with some embodiments.

FIG. 3 depicts an example block 300 of a memory cell array including selectable portions 131 (FIG. 1) of storage medium 130. In this example, the memory cell array is configured as a NAND array. The depicted configuration is one among many possible configurations, and those skilled in the art will appreciate that various other configurations have not been illustrated for the sake of brevity, and so as not to obscure more pertinent aspects of the example implementations disclosed herein.

In the example array, strings 302 (columns) are the smallest readable units, and are typically comprised of 32 or 64 memory cells. Strings may comprise other numbers of memory cells (e.g., more than 64, less than 32, or between 32 and 64), depending on the application. All strings in the array are connected at one end to a common source line 306 and at the other end to a bit line (e.g., BL0). Each string also contains two control transistors in series with the memory cells. String and ground select transistors are connected to the string select line (SGD) and ground select line (SGS).

In the example array, pages 304 (rows) share the same word line and are the smallest programmable units. They are typically comprised of at least 32,768 (32K), 64K, or 128K memory cells. Pages may comprise other numbers of memory cells (e.g., more than 128K, less than 32K, or between 32K and 128K), depending on the application. Typically, page sizes are referred to as 2K, 4K, 8K, and so forth. This signifies the page size in bytes. So if the page size has 32,768 memory cells (bits), this equates to 4,096 (4K) bytes.

In the example array, the block 300 is a two-dimensional matrix comprised of strings (columns) and pages (rows). The total number of bits in a block can be calculated by multiplying the number of strings by the number of pages. Depending on the memory operation to be carried out (e.g., read, program, erase), a selectable portion 131 of storage medium 130 includes a single page, a single string, or a single block.

Figure 4A:
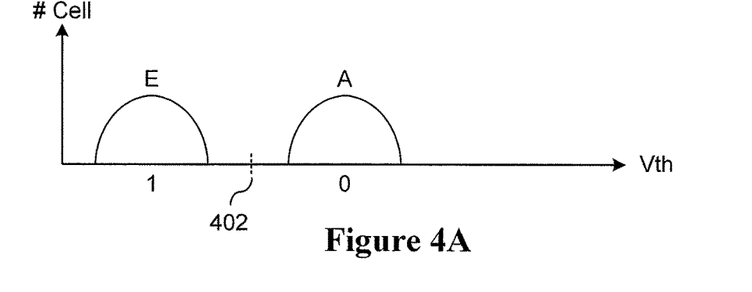
FIGS. 4A-4D are graphs showing threshold voltage distributions of example memory cells, in accordance with some embodiments.
Figure 4B:
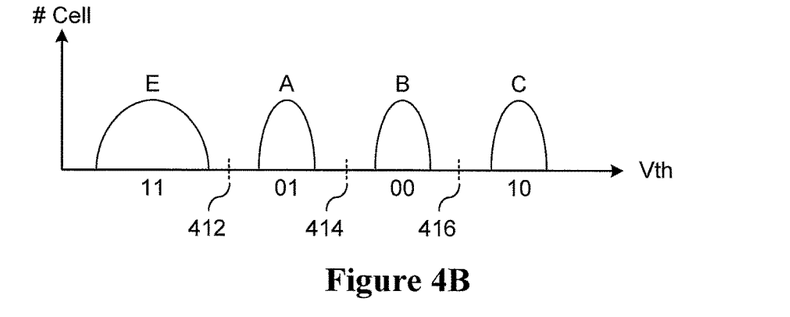
Figure 4C:
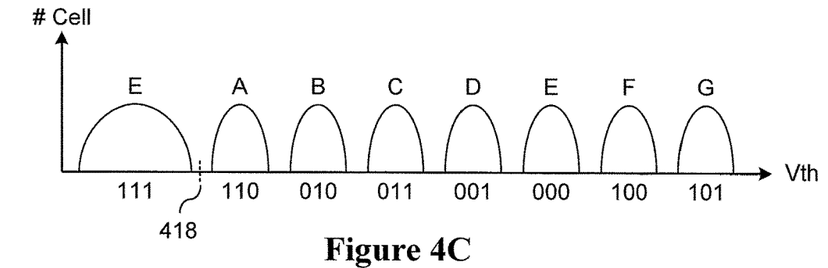

The memory cells in the memory array may have a threshold voltage Vth included in one of the distributions of FIGS. 4A-4C. FIG. 4A shows a cell distribution in a single-level cell (SLC) memory in which each cell is programmed by one bit. FIG. 4B shows a cell distribution in a 2-bit multi-level cell (MLC) memory in which each cell is programmed by two bits. FIG. 4C shows a cell distribution in a 3-bit multi-level cell (MLC) memory in which each cell is programmed by three bits. For an SLC flash memory, each cell of the array of FIG. 3 has a threshold voltage that is included in one of an erase state E and a program state A according to a value of programmed data, as shown in FIG. 4A. For a 2-bit MLC flash memory, each cell of the array of FIG. 3 has a threshold voltage that is included in any one of an erase state E and first to third program states A-C, as shown in FIG. 4B. For a 3-bit MLC flash memory, each cell of the array of FIG. 3 has a threshold voltage that is included in any one of an erase state E and first to seven program states A-G, as shown in FIG. 4C. However, the embodiments described herein are not limited to these three configurations. For instance, each cell may be programmed by four or more bits (TLC cells), or various cells in an array may be programmed by different numbers of bits, depending on the application.

Referring back to FIG. 3, reading the state of a memory cell (e.g., 308) requires discriminating voltage threshold levels of the cell, irrespective of the voltage threshold levels of all other cells in the string. To accomplish this, the string (e.g., 302) has to be connected to the sensing circuit (e.g., select lines SGD and SGS are high), and a particular bit line (e.g., BL3) is biased; therefore, a current can flow (e.g., through string 302) to the (grounded) source line. Unselected cells (e.g., the cells coupled to WL0 and WL2 through WL7) are then placed in a pass-transistor mode, biasing their word lines at a pass voltage larger than the maximum threshold voltage Vth. The actual read operation is then performed by applying a read voltage (e.g., to WL1), sensing the cell current through the string (BL3) of cells, and comparing the sensed current against fixed reference values to assess the corresponding binary code. The operation is performed more than one time for MLC cells.

FIGS. 4A-4C illustrate cell voltage thresholds and corresponding read voltage levels (also sometimes referred to as reference voltage levels) for read operations.

For instance, in an SLC memory cell (FIG. 4A), there are two threshold voltages—E (for the erase state: 1) and A (for the programmed state: 0). When applying a read voltage signal 402, if current flows through the memory cell, the cell is erased (e.g., logic 1). If current does not flow through the memory cell, the cell is programmed (e.g., logic 0).

In a two-bit MLC memory cell (FIG. 4B), there are four threshold voltages—E (for the erase state: 1), and A-C (for three programmed states: 01, 00, 10). When applying a read voltage signal 412, if current flows through the memory cell above a first threshold, the cell is erased (e.g., logic 11). When applying a voltage 414, if current flows below the first threshold but above a second threshold, the cell is in a first programmed state (e.g., logic 01). When applying a voltage 416, if current flows below the second threshold but above a third threshold, the cell is in a second programmed state (e.g., logic 00), and if current flows below the third threshold, the cell is in a third programmed state (e.g., logic 10).

In a three-bit MLC memory cell (FIG. 4C), there are eight threshold voltages—E (for the erase state: 1), and A-G (for seven programmed states: 110, 010, 011, 001, 000, 100, 101). When applying a read voltage 418, if current flows through the memory cell above a first threshold, the cell is erased (e.g., logic 111). The rest of the read voltages are selected such that they are between the voltage thresholds of the rest of the programmed states, as described above with regard to FIG. 4B.

Figure 4D:
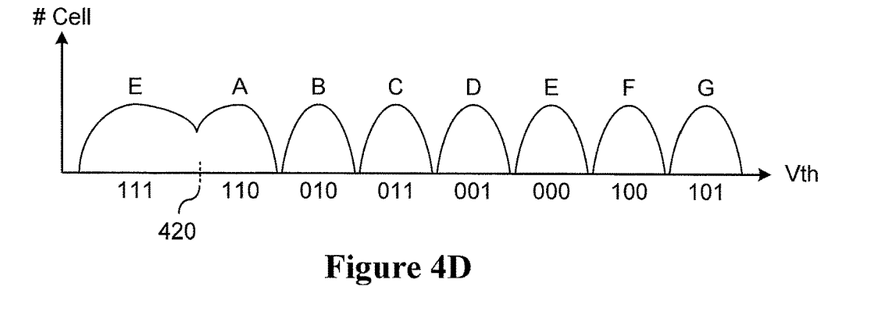

In certain scenarios, various states of a memory cell may overlap. For example, if the memory cell is in a first read condition, the erase (E) voltage threshold distribution may merge into the first programmed state voltage threshold distribution (A), as illustrated in FIG. 4D. This may cause read errors due to the read voltage 420 not being sufficiently separated from overlapping voltage threshold distributions (E and A). Stated another way, in scenarios exhibiting the behavior illustrated in FIG. 4D, a number of memory cells have erase voltage thresholds to the right of read voltage 420 and program voltage thresholds to the left of read voltage 420. Applying read voltage 420 to those cells leads to results that are the opposite of those from memory cells displaying normal behavior (as illustrated in FIG. 4C). As such, read errors occur for the memory cells with voltage thresholds in the overlapping portions of the E and A distributions.

In some scenarios, the errors described above may be the result of memory problems known as read disturbs. A read disturb error may be caused a particular cell is read more than a threshold number of times, which causes nearby cells to become programmed over time. If reading continually from one cell, that cell may not fail, but rather one of the surrounding cells may fail on a subsequent read. Read disturb issues tend to affect lower voltages, for example the voltage threshold distribution for the first programmed state (A). With read disturb noise, the voltage of an erased cell can be pushed over the A threshold such that the cell would behave as a programmed cell when being read, resulting in a read error.

An error may also be caused by the condition referred to as first read condition (or state or mode). The first read condition may occur due to static charge leakage at the cell that, when subsequently read, results in an error. In these scenarios, the read disturb error is referred to as a "first read disturb." Stated another way, when the memory cell is in a first read condition, this condition may cause a read disturb error. First read condition may be caused by a number of factors, including after an initialization event such as a power on or waking up event in the memory device, high temperatures (which cause the cell to slowly become programmed over time), and/or the amount of time between reads, among others. If the cell has not been read for a threshold amount of time, the probability that the cell will be in the first read condition rises.

One way to address first read issues is to place the memory cell into a "second read" or normal read condition (or state or mode) before attempting to read the cell. For example, a memory controller may send a pre-conditioning command prior to a read command to apply a pre-conditioning voltage to a plurality of word lines in a block in order to move the memory cells into the second read condition. Once the memory cell is in the second read mode condition, the error rate will be in line with the expected or target error rate for the block. As used herein, a "pre-conditioning command" refers to a particular prefix command sent prior to the actual read command applied to the memory. More generally, the command can be referred to a command that indicates that there is a pre-conditioning step used to put the entire reading block (or a particular memory cell) into the second read mode. This step can be optionally part of the read operation using an extra step before the read itself. This extra step can apply a substantial voltage to the entire word line population of a block. As noted above, this extra step can be implemented using a pre-conditioning prefix command.

However, there may be drawbacks to moving the cell into the second read condition in the manner noted above. For instance, applying a pre-conditioning command may cause additional read disturb errors due to the high voltages involved, which apply stress to the memory cells. Applying pre-conditioning command repetitively may actually load electrons into a permanent disturb layer. As a result, future reads from the affected memory cells lead to additional applications of pre-conditioning commands due to the increased read disturbs caused by past pre-conditioning commands, which results in even more read errors, and so forth. As such, avoiding the use of pre-conditioning commands when dealing with memory cells in first read mode would be desirable, in that it would lead to fewer first read read disturbs.

In some embodiments, instead of pre-conditioning the cell by moving it out of first read mode before reading from the cell, the memory controller leaves the cell in the first read mode, and instead shifts (or increases) the read voltage to account for the first read condition of the cell. In some embodiments, if the controller determines that the cell is in a first read condition, the controller reads the cell using read voltages that are optimized for the first read condition, before resorting to additional read-error handling. Additionally, in some embodiments, even if the controller does not determine that the cell is in a first read condition, the controller reads the cell using read voltages that are optimized for the first read condition if the initial read attempt (e.g., read with history 0 case) fails.

Figure 5:
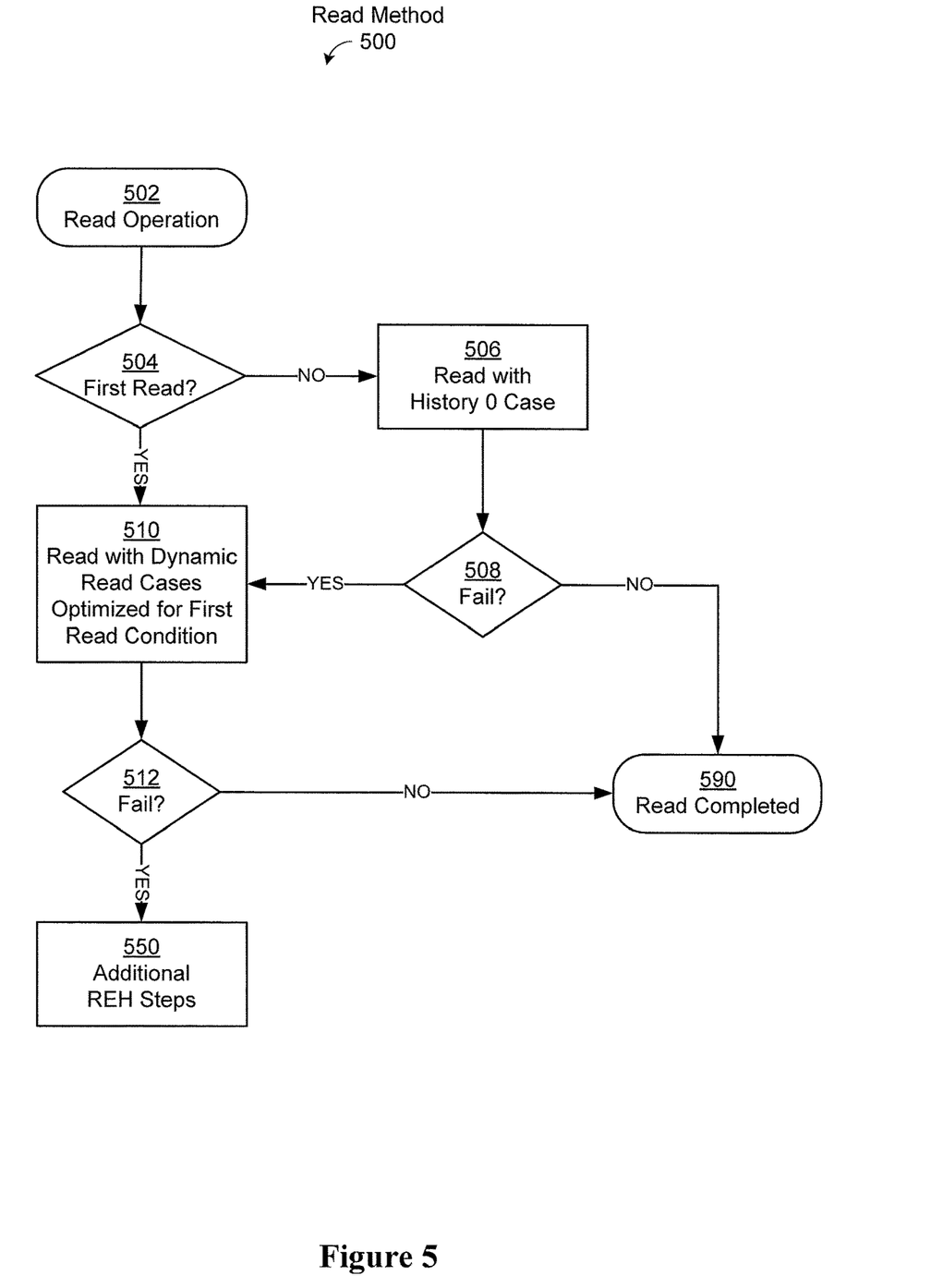
FIG. 5 is a flowchart of a method of reading data, including reading with dynamic read cases optimized for a first read condition, in accordance with some embodiments.

FIG. 5 depicts a flowchart of a method 500 of reading from a memory cell in the storage medium of a data storage device, and in particular, responding to a read command received from a host device when the memory cell may be in a first read condition or a second read condition. Method 500 is typically performed by the storage controller 124 or management module 121 of a storage device 120 or storage system, for example under the control of a data decode/recovery module 220 (FIG. 2), but alternatively may be performed by a computer system (e.g., computer system 110) in which a storage device is embedded.

A read command is received (502) from a computer system (alternatively referred to herein as a host or host system), such as computer system 110 (FIG. 1). The read command specifies data to be read from storage medium 130, such as by specifying a logical or physical address. In some embodiments, the controller, in response to the read command, controls a process of accessing and decoding the specified data so as to produce decoded data. At least part of the accessing and decoding process is described in more detail with regard to the steps below.

In response to the read command, the controller (e.g., first read detect module 222) determines (504) whether one or more memory cells corresponding to data specified in the read command are in a first read condition. In some embodiments, prior to receiving the data read command, the controller may determine whether the first memory cell, or a selectable portion of the memory array that includes the memory cell (e.g., portion 131) is in the first read condition, and set a flag corresponding to the memory cell (or selectable portion) based on the determination. For instance, the controller may determine that a portion of the storage medium such as the page (e.g., 304), the string (e.g., 302), or the block (e.g., 300) including the memory cell is in a first read condition due to an initialization event such as a powering on event, or a waking up event, among others. If so, the controller sets a flag for the cell, page, string, or block (whatever the case may be), signifying the first read status of the respective portion of memory. In that way, when the controller subsequently receives the read command that corresponds to the respective portion of memory, the controller may determine whether the respective memory cell is in the first read condition by checking the status of the respective flag, which is more efficient in some scenarios than waiting for the read command to make all of the first read status determinations.

In some embodiments, the controller determines whether a memory cell is in the first read condition by measuring an amount of time that has passed between a previous read operation involving the first memory cell, determining whether the measured amount of time meets a threshold, and setting the flag if the measured amount of time exceeds the threshold.

In some embodiments, the controller determines whether a memory cell is in the first read condition by counting a number of times a neighboring memory cell (or neighboring portion of memory) has been read, determining whether the number of times the neighboring memory cell has been read meets a threshold, and setting the flag if the number of times exceeds the threshold.

In some embodiments, the controller determines whether a memory cell is in the first read condition by automatically setting the flag after an initialization event such as when the memory array is powered up or woken up. In some embodiments, the controller may determine whether a memory cell is in the first read condition by determining how long it has been since the last time the memory cell was in the first read condition. In some embodiments, the controller determines whether a memory cell is in the first read condition by comparing an ambient temperature to a threshold. For example, if the ambient temperature is greater than the threshold, the controller determines that the memory cell is in a first read condition.

If the one or more memory cells corresponding to data specified in the read command are in a first read condition, the controller reads (510) the memory cell(s) with dynamic read cases optimized for the first read condition. In some embodiments, the controller reads a memory cell in the first read condition by using a read voltage optimized for the first read condition. Stated another way, the controller applies a read voltage (e.g., selected by read level select module 224) corresponding to a read operation for memory cells in the first read condition. While applying the read voltage, the controller performs the read operation by sensing a level of current, or lack thereof, through the memory cell. Based on the level of current, or lack thereof, the memory cell is erased or programmed as described above with reference to FIGS. 4A-4C.

In some embodiments, the read voltage values that are optimized for first read condition are predetermined prior to receiving the read command. In some embodiments, these predetermined read voltage levels, sometimes referred to herein as "first read read voltage" values, are stored in a table (e.g., table 242). In some embodiments, the first read read voltage values are preconfigured during the manufacturing process of the memory device. In some embodiments, the first read read voltage values are updated dynamically based on memory device performance, bit error rates, normal wear of the memory cell, or other read performance characteristics. In some embodiments, the first read read voltage values are updated dynamically using a cell voltage distribution (CVD) process.

It is important to note that the controller performs the read operation described above (with reference to step 510) while the memory cell is in the first read condition, rather than attempting to pre-condition the memory cell to a second read condition before reading. This way, the first read optimized read operation does not cause further read errors due to application of error-prone pre-conditioning measures (e.g., pre-conditioning command).

If the one or more memory cells corresponding to data specified in the read command are not in a first read condition, the controller reads (506) the memory cell(s) using read parameters that are not necessarily optimized for first read condition. For example, the controller reads the memory cell using a history case (e.g., history 0 case from history table 244). More specifically, the controller applies a read voltage level to the memory cell that corresponds to read operations for cells that are not in first read mode, and senses a level of current, or lack thereof, through the cell while applying the read voltage. Based on the level of current, or lack thereof, the memory cell is erased or programmed as described above with reference to FIGS. 4A-4C.

If a read attempt in step 506 results in an error (508), the controller reads (510) the memory cell(s) with dynamic read cases optimized for the first read condition, regardless of whether the memory cell(s) are in first read, second read, or any other read condition. It is important to note that this step happens before any additional read error handling processes are implemented, and without pre-conditioning the cell (e.g., using a pre-conditioning command).

If a read attempt in step 506 does not result in an error (508), the read operation for the memory cell being read is completed (590), and the sensed current is used as a basis for determining the program state (or erase state) of the cell, as described above with reference to FIGS. 4A-4C.

If a read attempt in step 510 results in an error (512), the controller optionally implements one or more additional read error handling (REH) steps (550) in order to read the memory cell(s). Example REH steps are described below with reference to FIG. 6. These steps are optional, and are not necessary to carry out the process as described in FIG. 5.

If a read attempt in step 510 does not result in an error (512), the read operation for the memory cell being read is completed (590), and the sensed current is used as a basis for determining the program state (or erase state) of the cell, as described above with reference to FIGS. 4A-4C.

In some embodiments, the controller does not carry out steps 506 and 508. Instead, if the controller determines that the memory cell is not in a first read condition (step 504), the method advances to step 550.

In some embodiments, the controller does not carry out step 504 upon initializing the memory device. Instead, when the memory device is initialized, the controller immediately skips to step 510 upon receiving a read command, assuming that the respective memory cell(s) are in a first read condition due to lack of recent usage of the memory device. For these embodiments, the controller optionally sets the first read flag for every memory cell (or selectable portion of memory) upon initialization of the memory device.

Figure 6:
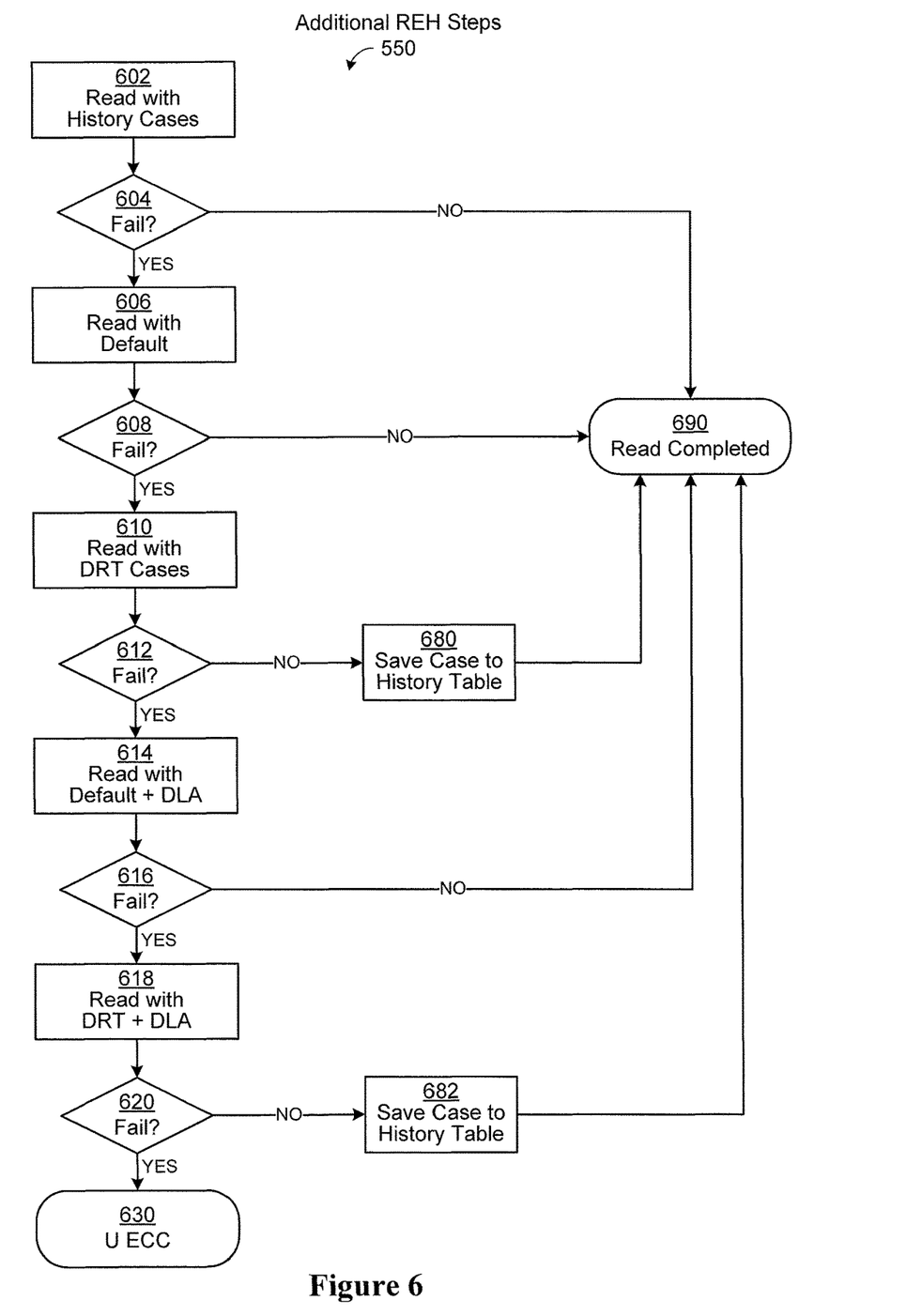
FIG. 6 is a flowchart of read error handling steps in accordance with some embodiments.

FIG. 6 depicts a flowchart of REH steps 600 which may be performed in conjunction with a read operation at, for example, step 550 in FIG. 5. Process 600 is typically performed by the storage controller 124 or management module 121 of a storage device 120 or storage system, for example under the control of a data decode/recovery module 220 (FIG. 2), but alternatively may be performed by a computer system (e.g., computer system 110) in which a storage device is embedded. Each step is optional, and the order of the steps may be changed according to the application.

The controller attempts to perform the read operation (602) with history cases (e.g., from history table 244). If this fails (604), the controller attempts to perform the read operation (606) with a default read voltage value (e.g., a default value 246). If this fails (608), the controller attempts to perform the read operation (610) using DRT cases (e.g., using values stored in dynamic read table 248). If this fails (612), the controller attempts to perform the read operation (614) using one or more default values with a data look ahead (DLA) process (e.g., using DLA module 226). If this fails (616), the controller attempts to perform the read operation (618) using one or more DRT values with a DLA process (e.g., using DLA module 226). If this fails (620), the controller attempts to perform the read operation (630) with an uncorrectable error correction code (ECC) process (e.g., using ECC module 228). If steps 612 or 620 do not fail, the controller updates (680, 682) the history table (e.g., table 244) with the read voltages so they can be used for subsequent read operations, and the read process is complete (690). If steps 604, 608, or 616 do not fail, the read operation is complete (690). When the read operation is complete, the sensed current, or lack thereof, during application of a respective read voltage is used as a basis for determining the program state (or erase state) of the cell, as described above with reference to FIGS. 4A-4C.

Figure 7:
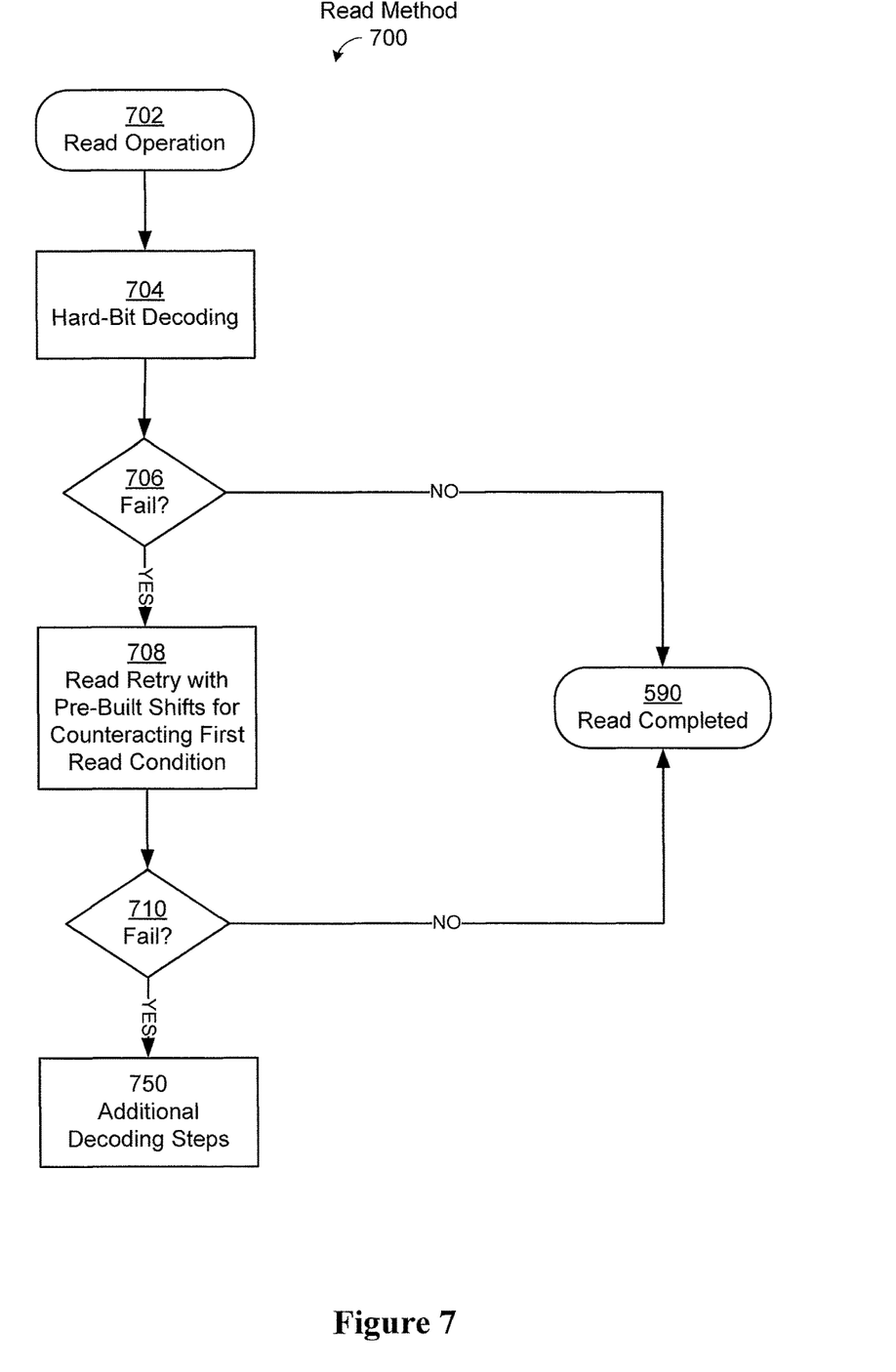
FIG. 7 is a flowchart of a method of reading data, including hard-bit decoding, in accordance with some embodiments.

FIG. 7 depicts a flowchart of a method 700 of reading from a memory cell in the storage medium of a data storage device, and in particular, responding to a read command received from a host device when the memory cell may be in a first read condition or a second read condition. Method 700 is typically performed by the storage controller 124 or management module 121 of a storage device 120 or storage system, for example under the control of a data decode/ recovery module 220 (FIG. 2), but alternatively may be performed by a computer system (e.g., computer system 110) in which a storage device is embedded.

A read command is received (702) from a computer system (alternatively referred to herein as a host or host system), such as computer system 110 (FIG. 1). The read command specifies data to be read from storage medium 130, such as by specifying a logical or physical address. In some embodiments, the controller, in response to the read command, controls a process of accessing and decoding the specified data so as to produce decoded data. At least part of the accessing and decoding process is described in more detail with regard to the steps below.

In response to the read command, the controller attempts to perform the read operation (704) using a hard-bit decoding process. If this fails (706), the controller reads (708) the memory cell(s) with one or more predetermined read levels optimized for first read condition (first read read voltages). This step is similar to step 510 in FIG. 5, and the features described above with regard to that step correspond to the features of step 708. If the first read optimized read operation fails (710), the controller optionally implements one or more additional read error handling (REH) steps (750) in order to read the memory cell(s). Example REH steps are described above with reference to FIG. 6. These steps are optional, and are not necessary to carry out the process as described in FIG. 7. In some embodiments, additional REH steps may include an LDPC (low density parity check) encoding flow, a BES (bit error scan), a soft-bit read, and/or an XOR read across the memory array. If a read operation does not fail (706, 710), the read operation is complete (590). When the read operation is complete, the sensed current, or lack thereof, during application of a respective read voltage is used as a basis for determining the program state (or erase state) of the cell, as described above with reference to FIGS. 4A-4C.

It will be understood that, although the terms "first," "second," etc. may be used herein to describe various elements, these elements should not be limited by these terms. With the exception of the phrases "first read condition" and "second read condition," the terms "first," "second," etc. are only used to distinguish one element from another. For example, a first contact could be termed a second contact, and, similarly, a second contact could be termed a first contact, without changing the meaning of the description, so long as all occurrences of the "first contact" are renamed consistently and all occurrences of the second contact are renamed consistently. The first contact and the second contact are both contacts, but they are not the same contact.

The phrases "first read condition" and "second read condition" describe art-recognized conditions of memory cells, the conditions being labeled "first read" (e.g., the first time a cell is being read after a threshold amount of time, or after powering on the memory device) and "second read" (e.g., a read operation that produces more accurate results due to the cell having been read before a threshold amount of time has passed, or due to the memory device having already been powered on). In general, these phrases are not interchangeable without changing the meaning of the element.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A data storage system, comprising a memory comprising a plurality of memory cells; and a controller in communication with the memory, the controller configured to:
   receive a data read command specifying data to be read;
   in response to the first data read command, control a process of accessing and decoding the specified data so as to produce decoded data, wherein at least part of the specified data is stored in a first memory cell, wherein the process of accessing and decoding the specified data includes:
      determining whether the first memory cell is in a first read condition;
      in accordance with a determination that the first memory cell is in the first read condition:
         applying a first voltage level to the first memory cell, the first voltage level being a predetermined voltage level corresponding to a read operation for memory cells in the first read condition; and
         sensing a first level of current, or lack thereof, through the first memory cell during application of the first voltage level to the first memory cell;
      in accordance with a determination that the first memory cell is not in the first read condition:
         applying a second voltage level separate and distinct from the first voltage level to the first memory cell, the second voltage level being a voltage level corresponding to a read operation for memory cells in a read condition other than the first read condition; and
         sensing a second level of current, or lack thereof, through the first memory cell during application of the second voltage level to the first memory cell.

2. The data storage system of claim 1, wherein the process of accessing and decoding the specified data further includes:
   in accordance with the determination that the first memory cell is not in the first read condition:
      determining whether the second level of current, or lack thereof, results in a read error, and
      in accordance with a determination that the second level of current, or lack thereof, results in a read error, applying the first voltage level to the first memory cell, the first voltage level being the predetermined voltage level corresponding to a read operation for memory cells in the first read condition, and sensing a third level of current, or lack thereof, through the first memory cell during application of the first voltage level to the first memory cell.

3. The data storage system of claim 1, wherein the process of accessing and decoding the specified data further includes:
   determining whether the first or third level of current, or lack thereof, results in a read error; and
   in accordance with the determination that the first or third level of current, or lack thereof, results in a read error, initiating one or more subsequent read error handling processes.

4. The data storage system of claim 3, wherein the one or more subsequent read error handling processes include performing a read attempt using:
   one or more read voltages using a history table;
   one or more default read voltages;
   one or more read voltages using a dynamic read table;
   a data look ahead (DLA) process;
   an error checking and correction (ECC) process; and/or
   a hard-bit decoding process.

5. The data storage system of claim 1, wherein the controller is further configured to:
   prior to receiving the data read command:
      predetermine whether the first memory cell is in the first read condition; and
      set a flag corresponding to the first memory cell in accordance with the determination of whether the first memory cell is in the first read condition; and
   subsequent to receiving the data read command:
      determine whether the first memory cell is in the first read condition by checking a status of the flag corresponding to the first memory cell.

6. The data storage system of claim 5, wherein predetermining whether the first memory cell is in the first read condition includes:
   measuring one or more of: (i) an amount of time that has passed between a previous read operation involving the first memory cell, and/or (ii) an ambient temperature;
   determining whether the measured amount of time and/or the ambient temperature meets a respective threshold; and
   setting the flag in accordance with a determination that the measured amount of time and/or the ambient temperature meets the respective threshold.

7. The data storage system of claim 5, wherein predetermining whether the first memory cell is in the first read condition includes:
   determining whether an initialization event associated with the memory cell has occurred; and
   setting the flag in accordance with a determination that the initialization event has occurred.

8. The data storage system of claim 1, wherein applying the first voltage level to the first memory cell includes:
   prior to receiving the data read command, storing, in a first read table or in a system file, one or more predetermined first read voltage levels corresponding to read operations for memory cells in the first read condition; and subsequent to receiving the data read command, applying the first voltage level based on the one or more predetermined first read voltage levels stored in the first read table or in the system file.

9. The data storage system of claim 8, wherein the controller is further configured to update one or more of the predetermined first read voltage levels for a subsequent read operation involving the first memory cell using read performance characteristics.

10. The data storage system of claim 1, wherein the controller is configured to apply the first voltage level to the first memory cell and sense the first level of current while the first memory cell is in the first read condition.

11. A method of operating a data storage system comprising a memory including a plurality of memory cells, and a controller in communication with the memory, the method comprising:
  receiving a data read command specifying data to be read;
  in response to the first data read command, controlling a process of accessing and decoding the specified data so as to produce decoded data, wherein at least part of the specified data is stored in a first memory cell, wherein the process of accessing and decoding the specified data includes:
    determining whether the first memory cell is in a first read condition;
    in accordance with a determination that the first memory cell is in the first read condition:
      applying a first voltage level to the first memory cell, the first voltage level being a predetermined voltage level corresponding to a read operation for memory cells in the first read condition; and
      sensing a first level of current, or lack thereof, through the first memory cell during application of the first voltage level to the first memory cell;
    in accordance with a determination that the first memory cell is not in the first read condition:
      applying a second voltage level separate and distinct from the first voltage level to the first memory cell, the second voltage level being a voltage level corresponding to a read operation for memory cells in a read condition other than the first read condition; and
      sensing a second level of current, or lack thereof, through the first memory cell during application of the second voltage level to the first memory cell.

12. The method of claim 11, wherein the process of accessing and decoding the specified data further includes:
  in accordance with the determination that the first memory cell is not in the first read condition:
    determining whether the second level of current, or lack thereof, results in a read error, and
    in accordance with a determination that the second level of current, or lack thereof, results in a read error, applying the first voltage level to the first memory cell, the first voltage level being the predetermined voltage level corresponding to a read operation for memory cells in the first read condition, and sensing a third level of current, or lack thereof, through the first memory cell during application of the first voltage level to the first memory cell.

13. The method of claim 11, wherein the process of accessing and decoding the specified data further includes:
  determining whether the first or third level of current, or lack thereof, results in a read error; and
  in accordance with the determination that the first or third level of current, or lack thereof, results in a read error, initiating one or more subsequent read error handling processes.

14. The method of claim 13, wherein the one or more subsequent read error handling processes include performing a read attempt using:
  one or more read voltages using a history table;
  one or more default read voltages;
  one or more read voltages using a dynamic read table;
  a data look ahead (DLA) process;
  an error checking and correction (ECC) process; and/or
  a hard-bit decoding process.

15. The method of claim 11, further comprising:
  prior to receiving the data read command:
    predetermine whether the first memory cell is in the first read condition; and
    set a flag corresponding to the first memory cell in accordance with the determination of whether the first memory cell is in the first read condition; and
  subsequent to receiving the data read command:
    determine whether the first memory cell is in the first read condition by checking a status of the flag corresponding to the first memory cell.

16. The method of claim 15, wherein predetermining whether the first memory cell is in the first read condition includes:
  measuring one or more of: (i) an amount of time that has passed between a previous read operation involving the first memory cell, and/or (ii) an ambient temperature;
  determining whether the measured amount of time and/or the ambient temperature meets a respective threshold; and
  setting the flag in accordance with a determination that the measured amount of time and/or the ambient temperature meets the respective threshold.

17. The method of claim 15, wherein predetermining whether the first memory cell is in the first read condition includes:
  determining whether an initialization event associated with the memory cell has occurred; and
  setting the flag in accordance with a determination that the initialization event has occurred.

18. The method of claim 11, wherein applying the first voltage level to the first memory cell includes:
  prior to receiving the data read command:
    predetermining one or more first read voltage levels corresponding to read operations for memory cells in the first read condition;
    storing the predetermined one or more first read voltage levels in a first read table; and
  subsequent to receiving the data read command:
    applying the first voltage level based on the predetermined one or more first read voltage levels stored in the first read table.

19. The method of claim 18, further comprising updating one or more of the predetermined first read voltage levels for a subsequent read operation involving the first memory cell using read performance characteristics.

20. A data storage system, comprising:
  means for receiving a data read command specifying data to be read;
  means for controlling, in response to the first data read command, a process of accessing and decoding the specified data so as to produce decoded data, wherein at least part of the specified data is stored in a first memory cell, wherein the process of accessing and decoding the specified data includes:

determining whether the first memory cell is in a first read condition;

in accordance with a determination that the first memory cell is in the first read condition:
- applying a first voltage level to the first memory cell, the first voltage level being a predetermined voltage level corresponding to a read operation for memory cells in the first read condition; and
- sensing a first level of current, or lack thereof, through the first memory cell during application of the first voltage level to the first memory cell;

in accordance with a determination that the first memory cell is not in the first read condition:
- applying a second voltage level to the first memory cell, the second voltage level being a voltage level corresponding to a read operation for memory cells in a read condition other than the first read condition; and
- sensing a second level of current, or lack thereof, through the first memory cell during application of the second voltage level to the first memory cell.

* * * * *